United States Patent [19]
Mori

[11] Patent Number: 5,400,344
[45] Date of Patent: Mar. 21, 1995

[54] SEMICONDUCTOR DEVICE WITH FUNCTION OF TESTING INSULATION DEFECT BETWEEN BIT LINES AND TESTING METHOD THEREFOR

[75] Inventor: Seiichi Mori, Tokyo, Japan

[73] Assignee: Kabushiki Kaisha Toshiba, Kawasaki, Japan

[21] Appl. No.: 29,236

[22] Filed: Mar. 10, 1993

[30] Foreign Application Priority Data

Mar. 24, 1992 [JP] Japan .................................. 4-066436

[51] Int. Cl.6 ............................................. G01R 31/28
[52] U.S. Cl. .................... 371/21.4; 365/201
[58] Field of Search ................ 371/21.4, 21.1, 21.2; 365/201, 185

[56] References Cited

U.S. PATENT DOCUMENTS 5,321,699 6/1994 Endoh et al. ................. 371/21.4

*Primary Examiner*—Vincent P. Canney
*Attorney, Agent, or Firm*—Banner, Birch, McKie & Beckett

[57] ABSTRACT

A semiconductor device of this invention includes a memory cell matrix having a plurality of memory cells arranged in a matrix form, a group of bit lines connected to the memory cells and disposed for respective columns of the memory cell matrix, and a testing circuit for effecting the test to check whether the memory cell matrix functions correctly or not. The testing circuit includes a first potential supplying circuit having an output terminal connected to even-numbered bit lines of the bit line group to supply a potential which is as high as 9V to the even-numbered bit lines and a second potential supplying circuit having an output terminal connected to odd-numbered bit lines of the bit line group to supply a potential which is as low as 0V to the odd-numbered bit lines.

21 Claims, 5 Drawing Sheets

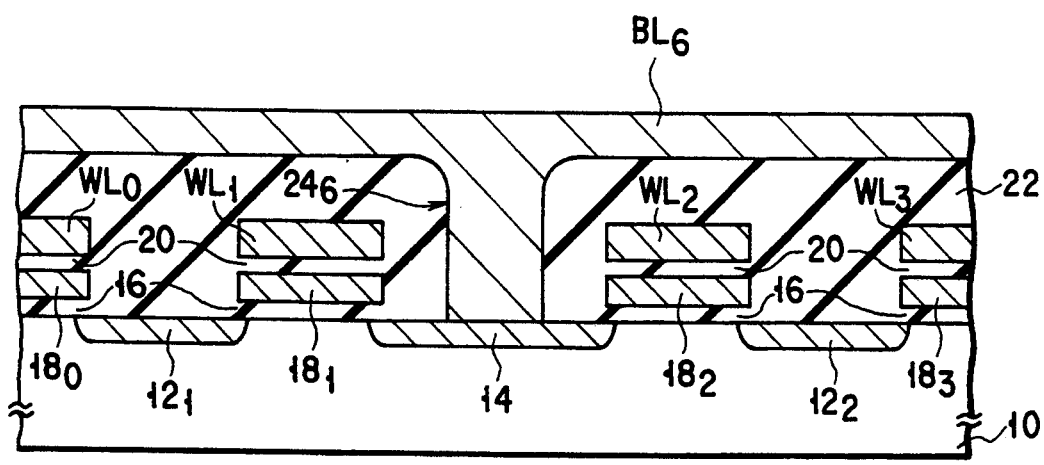
F I G. 2
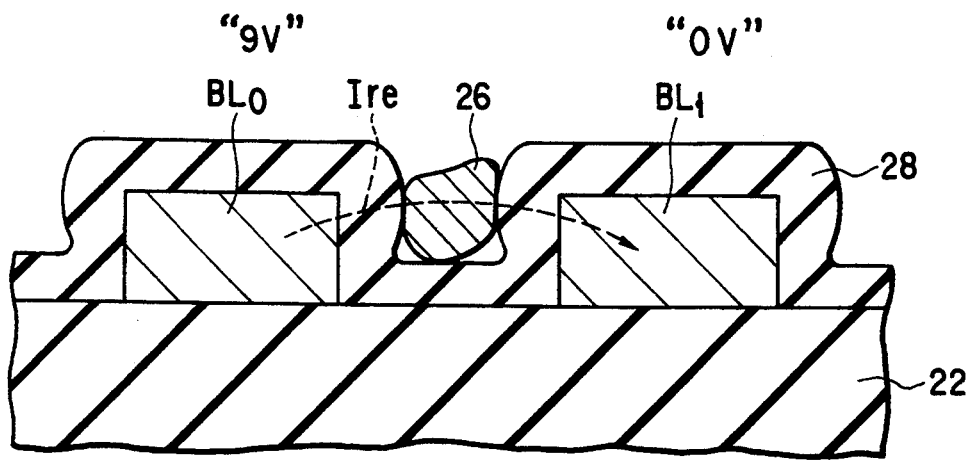
F I G. 5

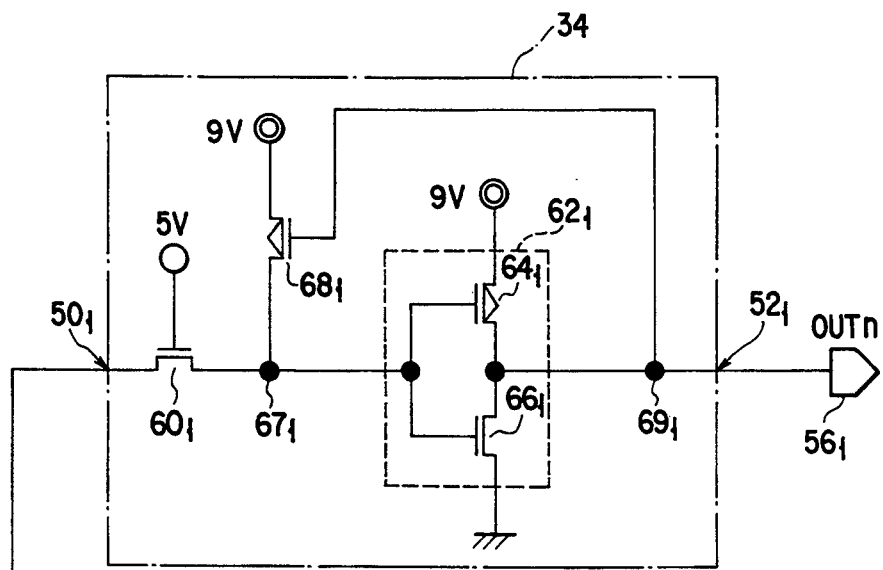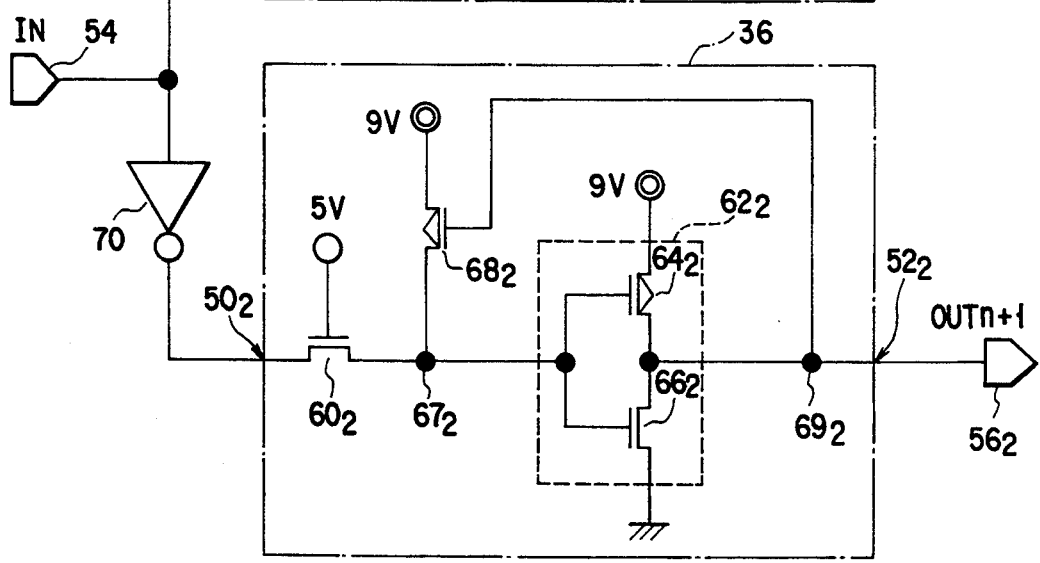
F I G. 3

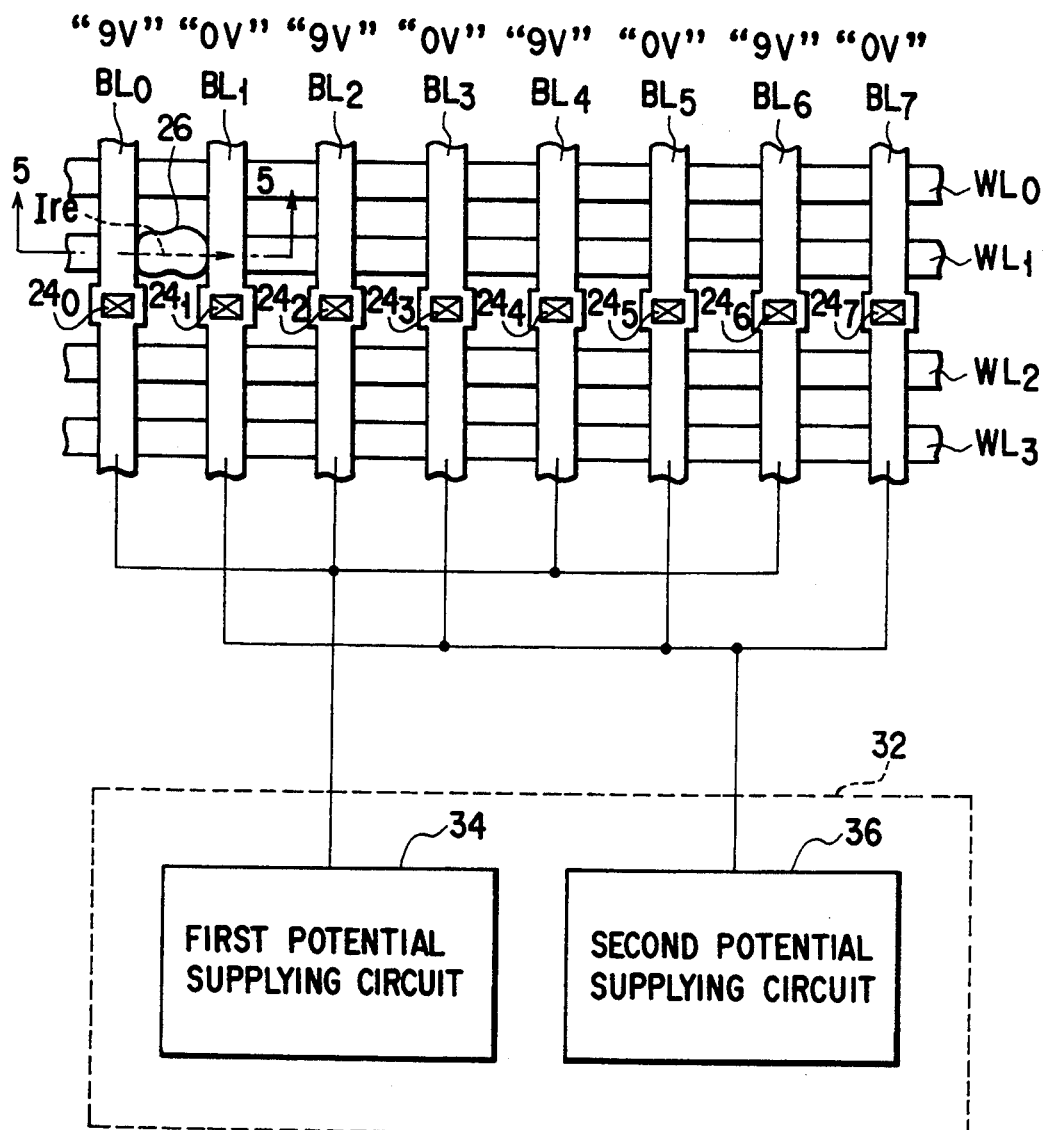
F I G. 4

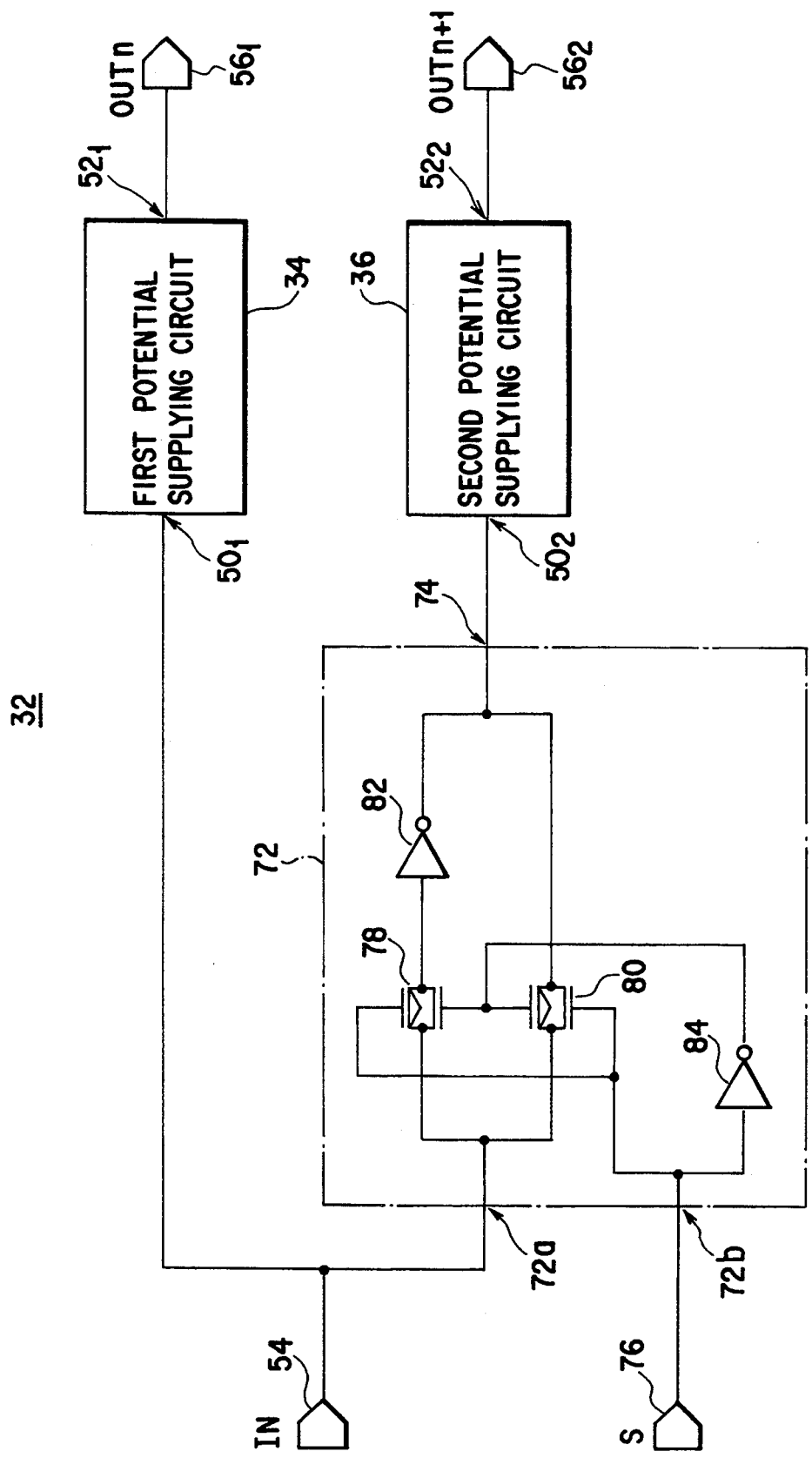
F I G. 6

SEMICONDUCTOR DEVICE WITH FUNCTION OF TESTING INSULATION DEFECT BETWEEN BIT LINES AND TESTING METHOD THEREFOR

Background of the Invention

1. Field of the Invention

This invention relates to a semiconductor device end a method for testing the same, and more particularly to a semiconductor device capable of detecting insulation defects between bit lines by affecting e simple test end a testing method therefor.

2. Description of the Related Art

As the device is increasingly miniaturized, spaces between the metal wiring layers become smaller. As the space becomes smaller, insulation between the metal wiring layers which has not raised any particular problems may cause a problem. For example, dusts such as silicon particles are attached to a portion between the metal wiring layers during or after the manufacturing process, the insulation between the metal wiring layers may be deteriorated. Particularly, the problem is serious in e case where the insulation is deteriorated with time, that is, the insulation defect occurs after the semiconductor device is actually used.

In e non-volatile memory such as an EPROM, EEPROM or flesh-EEPROM, e voltage which is as high as 6 to 10 V appears between the bit lines in the cell programming operation. Generally, the programming tests for the cells are effected before shipment, but in most cases, they are effected only a few times. The insulating condition between the bit lines will not be destroyed even if only such a few number of tests are effected, but in the actual use in which write-in operations are effected more than 100 times, the insulating condition between the bit lines may be broken by a mechanism such as TDDB (Time Dependent Dielectric Breakdown).

SUMMARY OF THE INVENTION

A first object of this invention is to provide a semiconductor device having a testing function capable of detecting the cause of insulation defect between bit lines in order to prevent the semiconductor device from being damaged by the insulation defect between the bit lines and a testing method capable of detecting the cause of the insulation defect.

A second object of this invention is to provide a semiconductor device improved to efficiently effect the test for detecting the cause of insulation defect and a testing method therefor.

A third object of this invention is to provide a semiconductor device having a testing function for checking the charge holding characteristic of memory cells in addition to the testing function for detecting the cause of insulation defect.

A fourth object of this invention is to provide a testing method for a semiconductor device capable of efficiently effecting both of the test for detecting the cause of insulation defect and the test for checking the charge holding characteristic of memory cells.

A fifth object of this invention is to provide a semiconductor device having a testing function capable of detecting the cause of insulation defect between wiring layers extending in parallel to each other in order to prevent the semiconductor device from being damaged by the insulation defect between the wiring layers extending in parallel to each other and a testing method capable of detecting the cause of insulation defect.

In this invention, in order to attain the above object, there is provided a semiconductor device which comprises a semiconductor substrate having a major surface; a function circuit formed in the substrate and having a preset function; a group of wiring layers connected to the function circuit and arranged in parallel to one another; and a testing circuit formed in the substrate. The testing circuit includes first potential supplying means connected to even-numbered wiring layers among the wiring layer group, for supplying a first potential to the even-numbered wiring layers and second potential supplying means connected to odd-numbered wiring layers among the wiring layer group, for supplying a second potential having a potential level different from the potential level of the first potential to the odd-numbered wiring layers.

A testing method for the semiconductor device according to this invention is to supply a first potential to even-numbered wiring layers among wiring layers constructing a wiring layer group and supply a second potential having a potential level different from the potential level of the first potential to odd-numbered wiring layers among the wiring layers constructing the wiring layer group with the first potential kept supplied to the even-numbered wiring layers. An electrical stress is caused between the wiring layers by supplying the first potential to the even-numbered wiring layers and supplying the second potential to the odd-numbered wiring layers.

With the above semiconductor device and testing method, a potential difference or electrical stress can be caused between the wiring layers. Therefore, if silicon particle or the like lies to extend over a portion between the wiring layers, the insulating condition of the portion between the wiring layers can be spontaneously broken down. The portion whose insulating condition is broken down will become a cause of the insulation defect between the wiring layers, and thus, the cause of the insulation defect can be detected in this invention. As a result, it becomes possible to prevent the semiconductor device from being damaged by the insulation defect between the wiring layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a cross sectional view taken along the lines 2—2 of FIG. 1;

FIG. 3 is a circuit diagram showing a testing circuit shown FIG. 1;

FIG. 4 is a diagram showing the application of stress in the semiconductor device according to one embodiment of this invention;

FIG. 5 is a cross sectional view taken along the lines 5—5 of FIG. 3; and

FIG. 6 is a circuit diagram showing another example of the testing circuit shown in FIG. 1.

DETAILED DESCRIPTION OF THE PREFERRED EMBODIMENTS

Figure 1:
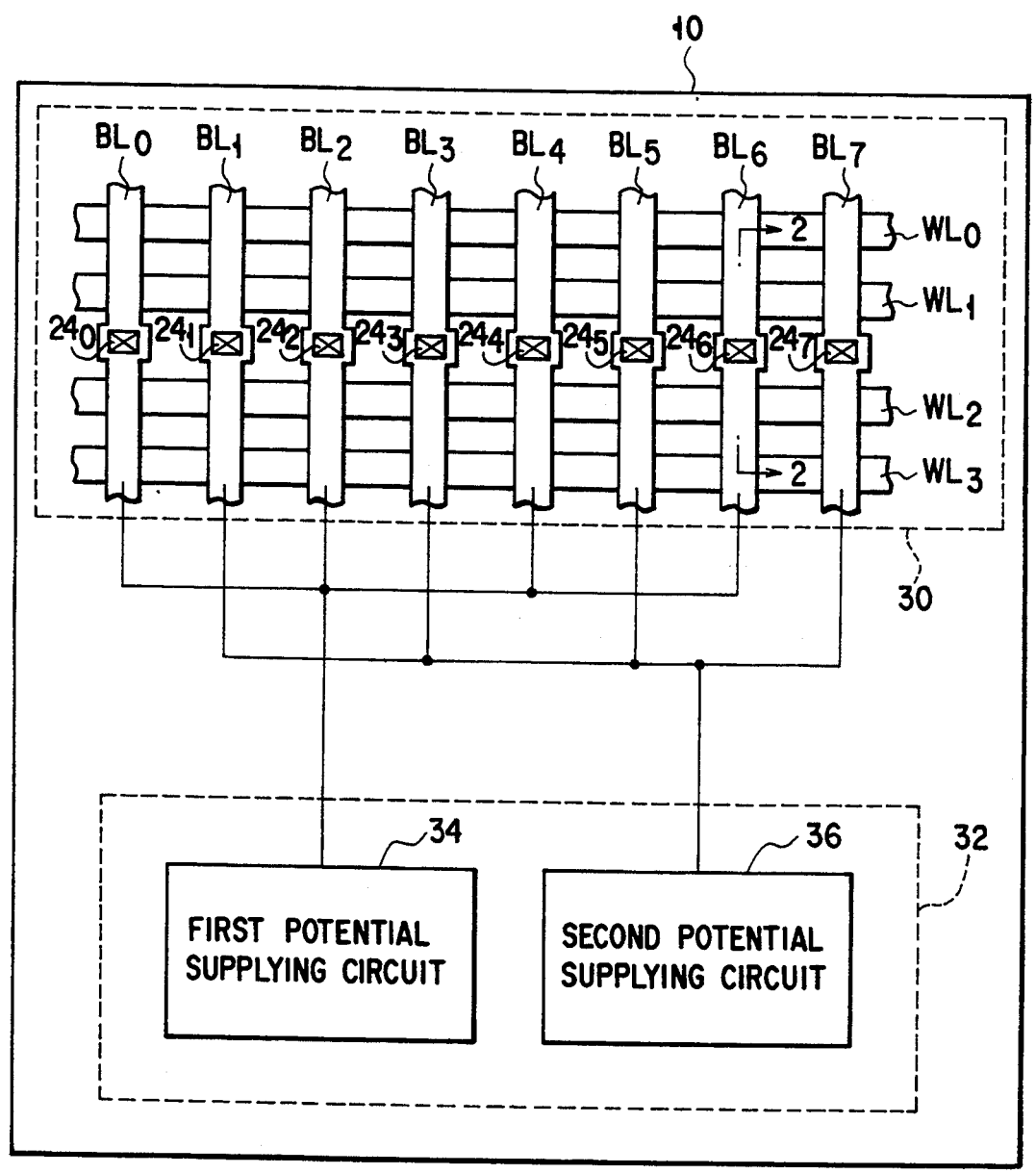
FIG. 1 is a block diagram showing a semiconductor device according to one embodiment of this invention.

There will now be described an embodiment of this invention with reference to the accompanying drawings. In the following explanation, the same portions shown in the drawings are denoted by the same reference numerals and the repetitive explanation therefor is omitted for simplicity.

FIG. 1 is a block diagram showing the basic construction of a semiconductor device according to one embodiment of this invention, FIG. 2 is a cross sectional view taken along the lines 2—2 of FIG. 1, and FIG. 3 is a circuit diagram showing a testing circuit shown in FIG. 1.

As shown in FIG. 1, a memory cell matrix 30 and a testing circuit 32 are formed in a P-type semiconductor substrate 10. The matrix 30 has a plurality of memory cells formed in a matrix form in the substrate 10. The memory cell has a cross section as shown in FIG. 2. The testing circuit 32 is provided to check whether the matrix 30 correctly functions or not before shipment of the semiconductor device. The testing circuit 32 includes a first potential supplying circuit 34 connected to those of bit lines $BL_0$ to $BL_7$ to which even numbers including 0 are attached as subscripts to supply a preset potential to the bit lines and a second potential supplying circuit 36 connected to those of the bit lines $BL_0$ to $BL_7$ to which subscripts of odd numbers are attached to supply a preset potential to the bit lines. Subscripts 0 to 7 are conveniently used to simplify the explanation of this invention and has no particular relation with respect to signals in the memory device such as address signals. Further, in this embodiment, eight bit lines are used, but any desired number of bit lines can be used if even-numbered and odd-numbered bit lines are respectively connected to the circuits 34 and 36 which can supply different potentials.

Next, the internal structure of the matrix 30 is explained in detail.

As shown in FIGS. 1 and 2, N-type source regions $12_1$ to $12_2$ and N-type drain regions 14 are formed in the P-type silicon substrate 10. Gate insulation films 16 formed of silicon oxide, for example, are formed on those portions of the substrate 10 which lie between the N-type source regions $12_1$ to $12_2$ and the N-type drain regions 14 and floating gates $18_0$ to $18_3$ formed of, for example, polysilicon are formed on the respective gate insulation films 16. Further, control gates (word lines) $WL_0$ to $WL_3$ which are formed of polysilicon or laminated layers of polysilicon and silicide, for example, are respectively formed over the floating gates $18_0$ to $18_3$ with insulation films 20 of silicon oxide, for example, disposed therebetween. An inter-level insulation layer 22 formed of silicon oxide or the like is formed on the substrate 10 to cover the control gates $WL_0$ to $WL_3$. Contact holes $24_0$ to $24_7$ reaching the corresponding drain regions 14 are formed in the inter-level insulation layer 22. Bit lines $BL_0$ to $BL_7$ are formed on the inter-level insulation layer 22 to be electrically connected to the respective drain regions 14 via the corresponding contact holes $24_0$ to $24_7$. The bit lines $BL_0$ to $BL_7$ are generally formed of aluminum alloy and called metal wiring layers. The bit lines $BL_0$ to $BL_7$ are formed to extend in a direction perpendicular to the word lines $WL_0$ to $WL_3$ in substantially the same plane and disposed on the respective columns of the matrix 30. The word lines $WL_0$ to $WL_3$ are disposed on the respective rows of the matrix 30.

In order to program data into the EPROM with the above structure, a voltage as high as 12.5 V is applied to the control gate and a voltage as high as 6 V is applied to the drain region, for example. By application of the above voltages, channel hot electrons are generated and injected into the floating gate, thus programming data.

At the time of data programming, bit lines adjacent to a selected bit line to which 6 V is applied are both set at 0V. That is, a voltage of 6 V occurs between the selected bit line and the adjacent bit line. Assume now that conductive dust 26 such as scrap silicon is attached between the bit line $BL_0$ which is selected and is applied with 9 V and the bit line $BL_1$ which is not selected and is applied with 0 V as shown in FIG. 4. If the data is repeatedly rewritten in this condition, an electrical stress causes a leak current $I_{re}$ to flow between the bit lines via the insulation film 28. This phenomenon may occur in one data programming cycle. In most cases, it occurs with time by a mechanism such as TDDB. Any bit line destroyed by the leak current from the beginning can be screened out in the pre-delivery test, but those destroyed by the leak current gradually increasing cannot be screened out in some cases. In the example of FIG. 5, the dust 26 is simply attached to the insulation film 28, but in a case where the dust 26 cuts into the insulation film 28 or the dust 26 is attached between the bit lines $BL_0$ and $BL_1$ before deposition of the insulation film 28, the leak current Ire may be more easily generated so that the possibility of dielectric breakdown will become high.

In the above embodiment, the testing circuit 32 shown in FIG. 1 is used in order to screen chips in which defects due to the breakdown of the insulating condition between the bit lines may occur.

Next, the construction of the testing circuit 32 is explained.

As shown in FIG. 3, the first potential supplying circuit 34 includes an input terminal $50_1$ and an output terminal $52_1$. The input terminal $50_1$ is connected to an input terminal section 54 which is supplied with an input signal IN indicating the start of the test. The output terminal $52_1$ is connected to a first output terminal portion $56_1$. The output terminal portion $56_1$ is connected to those of the bit lines $BL_0$ to $BL_7$ shown in FIG. 1 to which subscripts of even numbers including 0 are attached. A signal OUTn created in the potential supplying circuit 34 and having a preset potential is output from the output terminal portion $56_1$. The input terminal $50_1$ is connected to the drain (or source) of an N-channel transistor $60_1$ whose gate is applied with a potential of Vcc level (for example, 5 V) and the source (or drain) of the N-channel transistor $60_1$ is connected to the gates of a P-channel transistor $64_1$ and an N-channel transistor $66_1$ constructing an inverter section $62_1$. The output of the inverter section $62_1$ is connected to an output terminal $52_1$. The inverter section $62_1$ outputs either one of signals of "1" and "0" having a potential difference ranging from the ground potential (0 V) to 9 V. A node $67_1$ between the input of the inverter $62_1$ and the source (or drain) of the transistor $60_1$ is connected to the drain of a P-channel transistor $68_1$. The source of the P-channel transistor $68_1$ is connected to a power source of 9 V. The gate of the P-channel transistor $68_1$ is connected to a node $69_1$ between the output of the inverter $62_1$ and the output terminal $52_1$.

Like the first potential supplying circuit 34, the second potential supplying circuit 36 includes an input terminal $50_2$ and an output terminal $52_2$. The input terminal $50_2$ is connected to the output of an inverter 70 whose input is connected to an input terminal portion 54. The output terminal $52_2$ is connected to a second output terminal portion $56_2$. The output terminal portion $56_2$ is connected to those of the bit lines $BL_0$ to $BL_7$ shown in FIG. 1 to which subscripts of odd numbers are attached. A signal OUTn+1 created in the potential supplying circuit 36 and having a preset potential is output from the output terminal portion $56_2$. The construction of the remaining portion of the second potential supplying circuit 36 is substantially the same as that of the first potential supplying circuit 34, parts of the remaining portion are denoted by reference numerals having subscripts of $_2$ instead of $_1$ and the explanation therefor is omitted.

Next, the operation of the testing circuit 32 is explained.

First, a signal IN indicating the start of the test is input to the input terminal portion 54. When the signal IN is set at an "L" level, an "L" level signal is supplied to the inverter section $62_1$ in the first potential supplying circuit 34. As a result, a signal having a potential of approx. 9 V is output from the inverter section $62_1$ and a signal OUTn having a potential of approx. 9 V is output from the output terminal portion $56_1$.

Further, a signal which is set to an "H" level by the inverter section 70 is supplied to the inverter section $62_2$ in the second potential supplying circuit 36. As a result, a signal having substantially the ground potential (0 V) is output from the inverter section $62_2$ and a signal OUTn+1 having substantially the ground potential (0 V ) is output from the output terminal portion $56_2$.

Therefore, a potential of approx. 9 V is simultaneously applied to the bit lines $BL_0$, $BL_2$, $BL_4$ and $BL_6$ and a potential of approx. 0 V is simultaneously applied to the bit lines $BL_1$, $BL_3$, $BL_5$ and $BL_7$ so that a potential difference of approx. 9 V, that is, an electrical stress can be generated between the adjacent bit lines. In this embodiment, a potential difference of 9 V, which is greater than the potential difference of 6 V caused during the programming, is generated between the bit lines in order to achieve screening within a shorter time.

The semiconductor device set in the state of application of the electrical stress is shown in FIG. 4. FIG. 5 is a cross sectional view showing an enlarged portion of the dust 26 shown in FIG. 4 and the surrounding portion thereof. The state of application of the electrical stress between the bit lines as shown in FIG. 4 is maintained for a preset period of time. Then, defects which are caused by the attached dust 26 and have not been detected before the insulating condition is broken down by accumulation of the electrical stress can be detected in a short period of time. A period for maintaining the state shown in FIG. 4 is set to an optimal period which has been determined by the mechanism of the TDDB or the like and the test data actually acquired and which may be required for the insulating condition to be broken down via the dust 26 or the like in the state of application of the electrical stress caused during the programming. On the other hand, the potential difference between the bit lines is set to an optimal value which has been deter mined by the mechanism of the TDDB or the like and the test data actually acquired. In the circuit shown in FIG. 3, time for maintaining the state shown in FIG. 4 can be controlled by adjusting time of supply of the signal IN.

As shown in FIGS. 4 and 5, when the dust 26 such as scrap silicon is attached to the memory cell matrix, the insulating property of the insulation film 28, for example, is destroyed by application of the electrical stress after a preset period of time has elapsed and the bit lines $BL_0$ and $BL_1$ are short-circuited to each other via the dust 26, thereby causing a leak current Ire to flow. By detecting the leak current Ire, a portion which may cause the insulation defect between the wiring layers in future can be detected.

With the above method, the defective mode caused by the attached dust 26 can be detected in a shorter period of time than in the case of a method in which the write-in test for applying a potential to the bit lines is repeatedly effected to accumulate the electrical stress, for example.

Further, in the non-volatile memory which is a representative of the EEPROM cell, the defective mode in which electrons are passed through the floating gate and injected into the drain may occur, and in some cases, a circuit for checking the above defective mode, that is, a so-called drain stress testing circuit is provided in the device. The drain stress testing circuit is used to check whether or not electrons are extracted from the floating gate in a state in which the electrical stress is applied to the memory cell by simultaneously applying a voltage of 9 V , for example, to all of the bit lines after data has been programmed into most of the cells. It is possible to construct the testing circuit of FIG. 3 to have a function of drain stress test.

FIG. 6 shows an example of a testing circuit having both of the testing function (which is conveniently referred to as the bit line stress testing function) for detecting a portion which may cause the insulation defect and the testing function for checking the charge holding characteristic.

As shown in FIG. 6, a test mode switching circuit 72 for switching the test mode is provided instead of the inverter 70 shown in FIG. 3. The mode switching circuit 72 is supplied with a switching signal S for commanding the switching of the test modes and switches the test modes according to the switching signal S. The testing circuit 72 has first and second input terminals 72a and 72b and an output terminal 74. The first input terminal 72a is connected to an input terminal portion 4. The second input terminal 72b is connected to another input terminal portion 76. The other input terminal portion 76 is supplied with the switching signal S for commanding the switching of the test modes. Further, the output terminal 74 is connected to an input terminal $50_2$ of the second potential supplying circuit 36.

The first input terminal 72a of the switching circuit 72 is connected to inputs of first and second transfer gates 78 and 80. The transfer gates 78 and 80 are each constructed by an N-channel transistor and a P-channel transistor. The output of the first transfer gate 78 is connected to the output terminal 74 via an inverter 82. The output of the second transfer gate 80 is directly connected to the output terminal 74.

The second input terminal 72b of the switching circuit 72 is connected to the gates of N-channel transistors provided in the first and second transfer gates and 80 and connected to the gates of P-channel transistors provided in the transfer gates 78 and 80 via an inverter 84.

Next, the operation of the testing circuit shown in FIG. 6 is explained.

First, when the signal IN is set at the "L" level, a signal having a potential of approx. 9 V is output from the first potential supplying circuit 34 as explained with reference to FIG. 3 so that a signal OUT having a potential of approx. 9 V can be output from the output terminal section $56_1$.

Further, when the signal S is set at the "L" level, the transfer gates 78 and 80 are respectively turned on and off so that an "H" level signal will be supplied to the second potential supplying circuit 36. As a result, a signal having a potential of approx. ground potential level (0 V) is output from the second potential supplying circuit 36, and therefore, a signal OUTn+i having a potential of approx. ground potential level (0 V) is output from the output terminal portion $56_2$.

When the signal S is set at the "H" level, the transfer gates 78 and 80 are respectively turned off and on so that an "L" level signal will be supplied to the second potential supplying circuit 36. As a result, a signal having a potential of approx. 9 V is output from the second potential supplying circuit 36, and therefore, a signal OUTn+1 having a potential of approx. 9 V is output from the output terminal portion $56_2$.

That is, in the testing circuit 32 shown in FIG. 6, the bit line stress test can be effected when the signal S is set at the "L" level and the drain stress test can be effected when the signal S is set at the "H" level. Thus, an advantage that both of the bit line stress test and the drain stress test can be effected can be attained by use of the single testing circuit 32.

This invention can be modified as follows.

In a memory of large capacity, a redundancy circuit (column redundancy circuit) which can be used to replace the columns in the matrix 30 when at least one of the bit lines is defective is mounted. Therefore, if the defective portion is previously detected, it becomes possible to compensate for the defective portion in the test. It is desirable to effect the bit line stress test before the normal test such as the drain stress test is started.

In this case, the defective portion (column) in which bit lines are short-circuited to each other can be compensated for in the redundancy process. Of course, the defective portion occurring in the drain stress test can be compensated for in the redundancy process. After the redundancy process, the drain stress test and bit line stress test are effected to check whether the redundancy column is normal or not.

According to the testing method of this invention, for example, when a defective portion occurs and electrical breakdown occurs in this portion, bit lines in this portion are short-circuited to each other and a voltage between the bit lines is lowered. It is also considered that when some defective portions occur, for example, the voltage is lowered after the weakest one the defective portions is destroyed, making it impossible to specify the other defective portions. Therefore, it may be desired to divide the memory cell matrix into a preset number of blocks and effect the bit line process for each block. The block division can be effected by, for example, dividing the matrix for every preset number of columns, dividing each column into segments, that is, dividing the matrix for every preset number of word lines, or dividing the matrix for every preset number of columns and for every preset number of word lines.

Further, in the above embodiment, potentials of two different levels are alternately applied to the bit lines to attain electrical stresses between the bit lines, but if the electrical stress can be applied between the bit lines, potentials of three or more different potential levels may be used.

Further, it is preferable to check whether defects occur or not at the final stage after the package-sealing process. By effecting the checking process at the final stage, chips which are made defective by dusts attached thereto in the assembling step or package-sealing step can be eliminated.

In the above embodiment, this invention is explained by using the EPROM as an example, but this invention can be applied to the other non-volatile memories such as EEPROMs or simultaneously erasable type EEPROMs and the other memories such as static memories or dynamic memories having high-density wirings such as bit lines. Further, in the above embodiment, the defective mode caused by short-circuiting of the bit lines formed of aluminum alloy is explained, but the defective mode may occur when wiring layers formed of conductive material such as silicide other than the aluminum alloy are used. Therefore, in a semiconductor device having wiring layers formed of conductive material such as silicide disposed at high density, this invention can be applied. The wiring layer may be formed with multi-layered structure.

As described above, according to this invention, it is possible to provide a semiconductor device having a testing function capable of detecting the cause of insulation defect between wiring layers extending in parallel to each other in order to prevent the semiconductor device from being damaged by the insulation defect between the wiring layers extending in parallel to each other and a testing method capable of detecting the cause of insulation defect.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor substrate having a major surface;
   a function circuit formed in said substrate and having a preset function;
   a group of wiring layers connected to said function circuit and arranged in parallel to one another;
   a testing circuit formed in said substrate;
   first potential supplying means contained in said testing circuit and connected to even-numbered wiring layers in said wiring layer group, for supplying a first potential to said even-numbered wiring layers; and
   second potential supplying means contained in said testing circuit and connected to odd-numbered wiring layers in said wiring layer group, for supplying a second potential having a potential level different from the potential level of the first potential to said odd-numbered wiring layers.

2. The semiconductor device according to claim 1, wherein the potential level of the first potential is a positive level and the potential level of the second potential is a ground potential level.

3. The semiconductor device according to claim 1, wherein said function circuit is a memory matrix constructed by a plurality of memory cells and said wiring layer group is a bit line group.

4. The semiconductor device according to claim 1, wherein said second potential supplying means supplies the second potential to said odd-numbered wiring layers when said first potential supplying means supplies the first potential to said even-numbered wiring layers.

5. The semiconductor device according to claim 4, wherein an electrical stress is caused between said wiring layers by supplying said first potential to said even-numbered wiring layers and supplying said second potential to said odd-numbered wiring layers.

6. The semiconductor device according to claim 5, wherein the insulation property of a portion between said wiring layers is tested by causing an electrical stress between said wiring layers.

7. A semiconductor device comprising:
a memory cell matrix having a plurality of memory cells arranged in a matrix form;
a group of bit lines connected to said memory cells and provided for respective columns of said memory cell array;
a testing circuit for effecting the test to check whether said memory cell matrix correctly functions or not;
first potential supplying means contained in said testing circuit and having input and output terminals, said input terminal being supplied with a signal for commanding the start of the test and said output terminal being connected to even-numbered bit lines in said bit line group, for supplying a first potential to said even-numbered bit lines according to said signal; and
second potential supplying means contained in said testing circuit and having input and output terminals, said input terminal being supplied with said signal and said output terminal being connected to odd-numbered bit lines in said bit line group, for supplying a second potential having a potential level different from the potential level of the first potential to said odd-numbered bit lines according to said signal.

8. The semiconductor device according to claim 7, wherein the signal level of said signal supplied to said input terminal of said second potential supplying means is set to "0" when the signal level of said signal supplied to said input terminal of said first potential supplying means is set to "1" and the signal level of said signal supplied to said input terminal of said second potential supplying means is set to "1" when the signal level of said signal supplied to said input terminal of said first potential supplying means is set to "0".

9. The semiconductor device according to claim 7, wherein the potential level of said first potential is a positive level and the potential level of said second potential is a ground potential level.

10. The semiconductor device according to claim 7, wherein said second potential supplying means supplies the second potential to said odd-numbered bit lines when said first potential supplying means supplies the first potential to said even-numbered bit lines.

11. The semiconductor device according to claim 10, wherein an electrical stress is caused between said bit lines by supplying said first potential to said even-numbered bit lines and supplying said second potential to said odd-numbered bit lines.

12. The semiconductor device according to claim 11, wherein the insulation property of a portion between said wiring layers is tested by causing an electrical stress between said wiring layers.

13. A testing method for semiconductor devices, comprising the steps of:
supplying a first potential to even-numbered bit lines among bit lines constructing a bit line group;
supplying a second potential having a potential level different from the potential level of said first potential to odd-numbered bit lines among said bit lines constructing said bit line group with said first potential kept supplied to said even-numbered bit lines; and
causing an electrical stress between bit lines by supplying said first potential to said even-numbered bit lines and supplying said second potential to said odd-numbered bit lines.

14. The testing method for semiconductor devices, according to claim 13, wherein said electrical stress is caused to effect the test for insulation property in a portion between said bit lines.

15. The testing method for semiconductor devices, according to claim 14, further comprising the steps of:
supplying a third potential having the same potential level as said first potential to odd-numbered bit lines among said bit lines constructing said bit line group with said first potential kept supplied to said even-numbered bit lines; and
causing an electrical stress in said memory cells by supplying said first potential to said even-numbered bit lines and supplying said third potential to said odd-numbered bit lines.

16. The testing method for semiconductor devices, according to claim 15, wherein said electrical stress is caused to effect the test for the charge holding characteristics of said memory cells.

17. The testing method for semiconductor devices, according to claim 13, wherein said step of causing said electrical stress between said bit lines is effected after the packaging process.

18. The testing method for semiconductor devices, according to claim 15, wherein said step of causing said electrical stress between said bit lines and said step of causing said electrical stress in said memory cells are effected after the packaging process.

19. A semiconductor device comprising:
first supplying means for supplying a first potential to even-numbered bit lines among bit lines constructing a bit line group;
second potential supplying means for supplying a second potential having a potential level different from the potential level of said first potential to odd-numbered wiring layers among said bit lines constructing said bit line group; and
a testing circuit containing said first and second supplying means, for causing an electrical stress between said bit lines by causing said first potential to be supplied to said even-numbered bit lines and causing said second potential to be supplied to said odd-numbered bit lines.

20. The semiconductor device according to claim 19, further comprising:
third supplying means for supplying a third potential having the same potential level as said first potential to said odd-numbered bit lines among said bit lines constructing said bit line group with said first potential kept supplied to said even-numbered bit lines.

21. The semiconductor device according to claim 19, wherein said testing circuit contains said first, second and third supplying means, effects a first test mode for causing an electrical stress between said bit lines by causing said first potential to be supplied to said even-numbered bit lines and causing said second potential to be supplied to said odd-numbered bit lines, and effects a second test mode for causing an electrical stress in said memory cells by causing said first potential to be supplied to said even-numbered bit lines and causing said third potential to be supplied to said odd-numbered bit lines.

* * * * *